US012799591B2

(12) United States Patent
Huotari et al.

(10) Patent No.: US 12,799,591 B2
(45) **Date of Patent: *Nov. 17, 2026**

(54) APPARATUS FOR PROVIDING A GAS MIXTURE TO A REACTION CHAMBER AND METHOD OF USING SAME

(71) Applicant: ASM IP Holding B.V., Almere (NL)

(72) Inventors: Hannu Huotari, Espoo (FI); Todd Robert Dunn, Cave Creek, AZ (US); Michael Eugene Givens, Oud-Heverlee (BE); Jereld Lee Winkler, Gilbert, AZ (US); Paul Ma, Scottsdale, AZ (US); Eric Shero, Phoenix, AZ (US)

(73) Assignee: ASM IP Holding B.V., Almere (NL)

( * ) Notice: Subject to any disclaimer, the term of this patent is extended or adjusted under 35 U.S.C. 154(b) by 190 days.

This patent is subject to a terminal disclaimer.

(21) Appl. No.: 18/410,370

(22) Filed: Jan. 11, 2024

(65) Prior Publication Data

US 2024/0141486 A1 May 2, 2024

Related U.S. Application Data

(63) Continuation-in-part of application No. 17/842,057, filed on Jun. 16, 2022, now Pat. No. 12,473,641.

(60) Provisional application No. 63/213,089, filed on Jun. 21, 2021.

(51) Int. Cl.

| | |
|---|---|
| ***C23C 16/455*** | (2006.01) |
| ***C23C 16/44*** | (2006.01) |
| ***C23C 16/50*** | (2006.01) |
| ***C23C 16/52*** | (2006.01) |

(52) U.S. Cl.
CPC .... *C23C 16/45512* (2013.01); *C23C 16/4408* (2013.01); *C23C 16/45527* (2013.01); *C23C 16/45544* (2013.01); *C23C 16/50* (2013.01); *C23C 16/52* (2013.01)

(58) Field of Classification Search
None
See application file for complete search history.

(56) References Cited

U.S. PATENT DOCUMENTS

| | | | |
|---|---|---|---|
| 4,916,089 A | 4/1990 | Van et al. | |
| 6,142,456 A | 11/2000 | Machiya et al. | |
| 6,494,228 B2 | 12/2002 | Guillaume et al. | |
| 9,693,895 B2 | 7/2017 | Auld et al. | |
| 10,035,287 B2 | 7/2018 | Song | |
| 10,309,941 B2 | 6/2019 | Wapelhorst et al. | |
| 11,946,136 B2 | 4/2024 | Winkler et al. | |
| 12,473,641 B2 * | 11/2025 | Winkler ............ | C23C 16/45512 |
| 2001/0002581 A1 | 6/2001 | Nishikawa et al. | |

(Continued)

FOREIGN PATENT DOCUMENTS

| | | |
|---|---|---|
| CN | 2531250 Y | 1/2003 |
| CN | 101709346 A | 5/2010 |

(Continued)

*Primary Examiner* — Shamim Ahmed
*Assistant Examiner* — Bradford M Gates
(74) *Attorney, Agent, or Firm* — Snell & Wilmer L.L.P.

(57) ABSTRACT

Apparatus for mixing two or more gases prior to entering a reaction chamber, reactor systems including the apparatus, and methods of using the apparatus and systems are disclosed. The systems and methods as described herein can be used to, for example, pulse a mixture of two or more precursors to a reaction chamber.

20 Claims, 4 Drawing Sheets

(56) References Cited

U.S. PATENT DOCUMENTS

| | | | |
|---|---|---|---|
| 2003/0145789 | A1 | 8/2003 | Bauch et al. |
| 2004/0069610 | A1 | 4/2004 | Arno et al. |
| 2005/0034852 | A1 | 2/2005 | Irwin |
| 2006/0060139 | A1 | 3/2006 | Meneghini et al. |
| 2006/0107898 | A1 | 5/2006 | Blomberg |
| 2007/0039549 | A1 | 2/2007 | Shajii et al. |
| 2008/0035056 | A1 | 2/2008 | Okubo et al. |
| 2008/0220164 | A1 | 9/2008 | Bauch et al. |
| 2008/0282975 | A1 | 11/2008 | Rius |
| 2010/0263588 | A1 | 10/2010 | Zhiyin |
| 2011/0100295 | A1 | 5/2011 | Xi et al. |
| 2011/0147413 | A1 | 6/2011 | Oozaki et al. |
| 2012/0121731 | A1 | 5/2012 | Peters et al. |
| 2014/0027952 | A1 | 1/2014 | Fan et al. |
| 2016/0111258 | A1 | 4/2016 | Taskar et al. |
| 2016/0237564 | A1 | 8/2016 | Sieber et al. |
| 2017/0145564 | A1 | 5/2017 | Bertuch et al. |
| 2017/0259091 | A1 | 9/2017 | Harvey |
| 2020/0071820 | A1 | 3/2020 | Herle et al. |
| 2020/0308032 | A1 | 10/2020 | Domrese et al. |
| 2022/0168520 | A1 | 6/2022 | Acker et al. |

FOREIGN PATENT DOCUMENTS

| | | | |
|---|---|---|---|
| CN | 103278428 | A | 9/2013 |
| CN | 103900755 | A | 7/2014 |
| CN | 107271644 | A | 10/2017 |
| CN | 108561122 | A | 9/2018 |
| CN | 106525655 | B | 6/2019 |
| CN | 110312677 | A | 10/2019 |
| CN | 110318910 | A | 10/2019 |
| CN | 111707801 | A | 9/2020 |
| CN | 112121658 | A | 12/2020 |
| CN | 112129866 | A | 12/2020 |
| CN | 112145170 | A | 12/2020 |
| EP | 0308025 | B1 | 1/1992 |
| EP | 0415403 | B1 | 7/1992 |
| EP | 1617144 | A1 | 1/2006 |
| JP | H02132821 | A | 5/1990 |
| JP | H09116214 | A | 5/1997 |
| JP | H11156282 | A | 6/1999 |
| JP | 2000220533 | A | 8/2000 |
| JP | 2004031582 | A | 1/2004 |
| JP | 2013075277 | A | 4/2013 |
| JP | 2013197594 | A | 9/2013 |
| JP | 2015023049 | A | 2/2015 |
| JP | 6403057 | B2 | 10/2018 |
| KR | 19990011469 | A | 2/1999 |
| KR | 20160143478 | A1 | 12/2016 |
| KR | 20160144905 | A | 12/2016 |
| KR | 20170080463 | A | 7/2017 |
| KR | 20170097427 | A | 8/2017 |
| KR | 20200141326 | A | 12/2020 |
| WO | 9607813 | A1 | 3/1996 |
| WO | 2006075709 | A1 | 7/2006 |
| WO | 2007097717 | A2 | 8/2007 |
| WO | 2011139272 | A1 | 11/2011 |
| WO | 2016200170 | A1 | 12/2016 |
| WO | 2018028876 | A1 | 2/2018 |
| WO | 2018033144 | A1 | 2/2018 |
| WO | 2020076333 | A1 | 4/2020 |
| WO | 2021163501 | A1 | 8/2021 |

* cited by examiner

APPARATUS FOR PROVIDING A GAS MIXTURE TO A REACTION CHAMBER AND METHOD OF USING SAME

CROSS-REFERENCE TO RELATED APPLICATIONS

This application is a continuation-in-part application, which claims priority to application Ser. No. 17/842,057, filed Jun. 16, 2022 and entitled "APPARATUS FOR PROVIDING A GAS MIXTURE TO A REACTION CHAMBER AND METHOD OF USING SAME," which is a nonprovisional of, and claims priority to and the benefit of, U.S. Provisional Patent Application No. 63/213,089, filed Jun. 21, 2021 and entitled "APPARATUS FOR PROVIDING A GAS MIXTURE TO A REACTION CHAMBER AND METHOD OF USING SAME," the contents of each of which are hereby incorporated by reference herein.

FIELD OF INVENTION

The present disclosure generally relates to gas-phase reactor systems and methods of using same. More particularly, the disclosure relates to apparatus for providing a gas mixture to a reaction chamber of a reactor system.

BACKGROUND OF THE DISCLOSURE

Gas-phase reactors, such as chemical vapor deposition (CVD), plasma-enhanced CVD (PECVD), atomic layer deposition (ALD), and the like can be used for a variety of applications, including depositing and etching materials on a substrate surface. For example, gas-phase reactors can be used to deposit and/or etch layers on a substrate to form semiconductor devices, flat panel display devices, photovoltaic devices, microelectromechanical systems (MEMS), and the like.

A typical gas-phase reactor system includes one or more reactors, each reactor including one or more reaction chambers; one or more precursor and/or reactant gas sources fluidly coupled to the reaction chamber(s); one or more carrier and/or purge gas sources fluidly coupled to the reaction chamber(s); one or more gas distribution systems to deliver gases (e.g., the precursor/reactant gas(es) and/or carrier or purge gas(es)) to a surface of a substrate within a reaction chamber; and at least one exhaust source fluidly coupled to the reaction chamber(s).

In some processes carried out in reaction chambers, it may be desirable to provide two or more gases to the reaction chamber at the same time or overlapping in time. For example, two, three, four or more gases can be separately provided to a reaction chamber at the same time or overlapping in time. While such apparatus may be suitable for some applications, providing gases separately to the reaction chamber may result in undesired variability in a process. Accordingly, improved apparatus for providing a gas mixture to a reaction chamber are desired.

Any discussion of problems and solutions involved in the related art has been included in this disclosure solely for the purposes of providing a context for the present disclosure, and should not be taken as an admission that any or all of the discussion was known at the time the invention was made.

SUMMARY OF THE DISCLOSURE

Various embodiments of the present disclosure relate to apparatus for providing a gas mixture to a reactor or a reaction chamber, to systems including the apparatus, and to methods of using the apparatus and systems. The apparatus, systems and methods can be used in connection with a variety of applications, including, for example, the manufacturing of electronic devices. While the ways in which various embodiments of the present disclosure address drawbacks of prior methods and systems are discussed in more detail below, in general, various embodiments of the disclosure provide improved apparatus systems and methods suitable for providing a mixture of two or more gases to a reaction chamber. Exemplary apparatus can, for example, reduce the time scale for diffusion of gas, thereby improving mixing of gases and/or reducing an amount of time to mix gases prior to entering the reaction chamber. Further examples of the disclosure provide improved apparatus and methods for providing pulses of mixed gas.

In accordance with at least one embodiment of the disclosure, an apparatus for providing a gas mixture to a reaction chamber includes a gas injection port, a mixing device upstream of and in fluid communication with the gas injection port, a first gas source comprising a first vessel and a first precursor therein, a second gas source comprising a second vessel and a second precursor therein, a first gas pulse valve fluidly coupled to the first vessel and to the mixing device, a second gas pulse valve fluidly coupled to the second vessel and to the mixing device, and a first pressure flow control valve fluidly coupled between the first vessel and a carrier gas source. In some cases, the gas injection port can be considered to form part of a reactor, rather than the apparatus. In accordance with further examples of the disclosure, the apparatus further comprises a purge valve fluidly coupled to the first gas pulse valve and the second gas pulse valve. In accordance with further examples of the disclosure, the apparatus includes three, four, or more gas sources coupled to the mixing device.

In accordance with further examples of the disclosure, an apparatus for providing a gas mixture to a reaction chamber includes a gas injection port, a mixing device upstream of and in fluid communication with the gas injection port, a first gas source comprising a first vessel and a first precursor therein, a second gas source comprising a second vessel and a second precursor therein, a first gas valve fluidly coupled to the first vessel and to the mixing device, a second gas valve fluidly coupled to the second vessel and to the mixing device, a first pressure flow control valve fluidly coupled between the first vessel and a carrier gas source, and a pulse valve between the mixing device and the gas injection port. Similar to above, the gas injection port can form part of a reactor. In accordance with exemplary aspects of these examples, the apparatus further comprises a bypass valve downstream of the mixing device. In accordance with further aspects, the apparatus further comprises a purge gas valve in fluid communication with a purge gas source and the pulse valve. In accordance with further examples of the disclosure, the apparatus includes three, four, or more gas sources coupled to the mixing device.

In accordance with one or more embodiments of the disclosure, the mixing device includes multiple sections to facilitate rapid and/or desired mixing of two or more gases. For example, the mixing device can include a first section comprising a first inlet, a first outlet, and a first volume 403 therebetween; and a second section comprising a second inlet, a second outlet, and a second volume 419 therebetween. The first inlet can be upstream of the second inlet, the first outlet can be downstream of the second inlet, and/or the first outlet can be upstream of the second outlet. In accordance with further examples, the mixing device can further include a third section. The third inlet can be downstream of the second inlet and upstream of the second outlet, the second outlet can be within the third volume, and/or the first outlet can be within the second volume.

In accordance with additional embodiments of the disclosure, a method controlling a gas flow to a reaction chamber using an apparatus as described herein is disclosed.

In accordance with yet further examples of the disclosure, a system including an apparatus as described herein is disclosed.

In accordance with further embodiments of the disclosure, a deposition process is provided. In accordance with examples of these embodiments, the deposition process includes providing an apparatus that includes a gas injection port and a mixing device, providing the reactant to the mixing device through a first inlet, and providing the first precursor to the mixing device through a second inlet. The apparatus can further include a first gas source comprising a first vessel and a reactant therein, a second gas source comprising a second vessel and a first precursor therein, a first gas pulse valve fluidly coupled to the first vessel and to the mixing device, and a second gas pulse valve fluidly coupled to the second vessel and to the mixing device. As above, the mixing device can suitably be located upstream of and in fluid communication with the gas inlet port. The mixing device can include a first inlet and a second inlet, wherein the first inlet is upstream of the second inlet. The gas injection port and the mixing device can be similar to the gas injection ports and the gas mixing devices described above and elsewhere herein. In accordance with examples of these embodiments, the step of providing the reactant to the mixing device includes pulsing the reactant to the mixing device. In accordance with further examples, the step of providing the first precursor to the mixing device includes pulsing the first precursor to the mixing device. In accordance with further examples, the process includes maintaining a steady state pressure within the first vessel to provide a controlled flow of the reactant to the mixing device. In some cases, the process includes providing a second precursor to the mixing device and mixing the second precursor with the first precursor within the mixing device. In accordance with further examples, the process includes forming a plasma—e.g., within a reaction chamber.

In accordance with yet additional embodiments of the disclosure, a deposition process includes providing an apparatus comprising a gas injection port, a mixing device upstream of and in fluid communication with the gas injection port, a first gas source comprising a first vessel and a first precursor therein, and a second gas source comprising a second vessel and a second mixture precursor therein; and pulsing a mixture of the first precursor and the second precursor from the mixing device to the gas injection port. In accordance with examples of these embodiments, the mixing device comprises a first inlet and a second inlet, wherein the first inlet is upstream of the second inlet. The method can further include providing a reactant to the mixing device. In such cases, the reactant can be provided to the first inlet and/or upstream of the first precursor and the second precursor. In accordance with various examples of these embodiments, the process includes pulsing the reactant to the gas injection port, wherein the steps of pulsing the reactant and pulsing the mixture are separated in time—i.e., do not overlap in time. In accordance with yet further examples, a combination of the reactant and the mixture is pulsed to the gas injection port.

In accordance with yet additional exemplary embodiments of the disclosure, an apparatus for providing a gas mixture to a reaction chamber includes a gas injection port, a mixing device upstream of and in fluid communication with the gas injection port, a first gas source comprising a first vessel and a reactant therein, a second gas source comprising a second vessel and a first precursor therein, a third gas source comprising a third vessel and a second precursor therein, a first gas valve fluidly coupled to the first vessel and to the mixing device, and a second gas valve fluidly coupled to the second vessel and to the mixing device. In accordance with examples of these embodiments, the mixing device comprises a first inlet, a second inlet, and a third inlet, wherein the first inlet is upstream of the second inlet, wherein the second inlet is upstream of the third inlet, wherein the reactant is provided to the first inlet, wherein the first precursor is provided to the second inlet, and wherein the second precursor is provided to the third inlet. In accordance with examples of these embodiments, the apparatus includes a controller configured to provide the reactant to the first inlet. In some cases, the controller is configured to provide the reactant to the first inlet (e.g., only) after a predetermined number of deposition cycles or pulses of the first precursor, the second precursor, and/or a gas mixture to the reaction chamber. In some cases, the first precursor, and the second precursor are mixed within the mixing device to form the gas mixture. In accordance with yet further examples of the disclosure, the apparatus further includes a pulse valve between the mixing device and the gas injection port.

These and other embodiments will become readily apparent to those skilled in the art from the following detailed description of certain embodiments having reference to the attached figures; the invention not being limited to any particular embodiment(s) disclosed.

BRIEF DESCRIPTION OF THE DRAWING FIGURES

A more complete understanding of exemplary embodiments of the present disclosure can be derived by referring to the detailed description and claims when considered in connection with the following illustrative figures.

Figure 1:
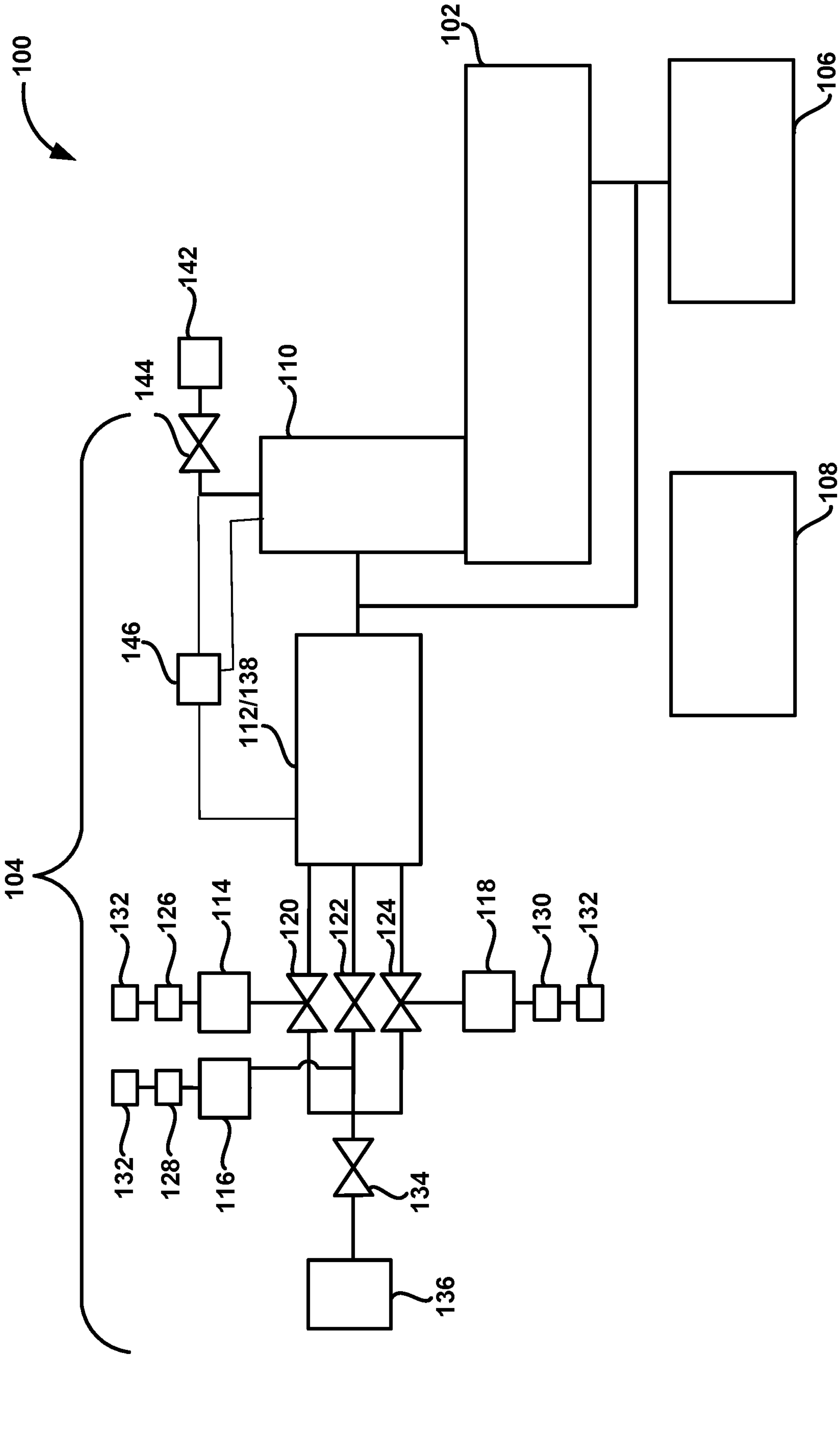
FIG. 1 illustrates a reactor system including an apparatus in accordance with at least one embodiment of the disclosure.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

The present disclosure generally relates to gas-phase apparatus, reactor systems, and methods (also referred to herein as processes). The apparatus, systems and methods as described herein can be used to process substrates, such as semiconductor wafers, to form, for example, electronic devices. By way of examples, the systems and methods described herein can be used to form or grow multi-component layers, such as layers comprising crystalline or amorphous indium gallium zinc oxide or crystalline or amorphous mixtures comprising at least two of the following: indium, gallium or zinc, and oxygen or crystalline or amorphous mixtures comprising at least one of the following: indium, gallium or zinc, and at least a second metal or semi-metal, and oxygen.

In this disclosure, "gas" can include material that is a gas at normal temperature and pressure (NTP), a vaporized solid and/or a vaporized liquid, and can be constituted by a single gas or a mixture of gases, depending on the context. A gas other than a process gas, i.e., a gas introduced without passing through a gas distribution assembly, other gas distribution device, or the like, can be used for, e.g., sealing the reaction space, and can include a seal gas, such as a rare gas.

The term "precursor" can refer to a compound that participates in the chemical reaction that produces another compound. The term "reactant" can be used interchangeably with the term precursor. The term "inert gas" can refer to a gas that does not take part in a chemical reaction and/or does not become a part of a layer to an appreciable extent. Exemplary inert gases include helium and argon and any combination thereof. In some cases, molecular nitrogen and/or hydrogen can be an inert gas. A carrier gas can be or include an inert gas.

As used herein, the term "substrate" may refer to any underlying material or materials that may be used to form, or upon which, a device, a circuit, or a film may be formed. A substrate can include a bulk material, such as silicon (e.g., single-crystal silicon), other Group IV materials, such as germanium, or compound semiconductor materials, such as GaAs, and can include one or more layers overlying or underlying the bulk material. Further, the substrate can include various topologies, such as recesses, lines, and the like formed within or on at least a portion of a layer of the substrate.

The term "cyclic deposition process" or "cyclical deposition process" can refer to the sequential introduction of precursors (and/or reactants) into a reaction chamber to deposit a layer over a substrate and includes processing techniques, such as atomic layer deposition (ALD), cyclical chemical vapor deposition (cyclical CVD), and hybrid cyclical deposition processes that include an ALD component and a cyclical CVD component. The process may comprise a purge step between introducing precursors. In some cases, one or more reactants and/or precursors can be continuously provided to the reaction chamber and one or more other reactants and/or precursors can be pulsed to the reaction chamber. In some cases, a plasma power can be pulsed—e.g., each cycle of the cyclic deposition process can include one or more pulses of plasma power.

The term "atomic layer deposition" can refer to a vapor deposition process in which deposition cycles, typically a plurality of consecutive deposition cycles, are conducted in a process chamber. The term "atomic layer deposition," as used herein, is also meant to include processes designated by related terms, such as chemical vapor atomic layer deposition, when performed with alternating pulses of precursor(s)/reactive gas(es), and purge (e.g., inert carrier) gas(es).

As used herein, the term "plasma enhanced atomic layer deposition" (PEALD) may refer to an ALD process in which one or more precursors, reactants, and/or other gases are exposed to a plasma to form excited species.

Further, in this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like. Further, in this disclosure, the terms "including," "constituted by" and "having" can refer independently to "typically or broadly comprising," "comprising," "consisting essentially of," or "consisting of" in some embodiments. In this disclosure, any defined meanings do not necessarily exclude ordinary and customary meanings in some embodiments.

Turning now to the figures, FIG. 1 illustrates a reactor system 100 in accordance with at least one embodiment of the disclosure. Reactor system 100 includes a reaction chamber 102, an apparatus 104 for providing a gas mixture to the reaction chamber 102, a vacuum source 106, and a controller 108.

Reaction chamber 102 can be or include a reaction chamber suitable for gas-phase reactions. Reaction chamber 102 can be formed of suitable material, such as quartz, metal, or the like, and can be configured to retain one or more substrates for processing. Reactor system 100 can include any suitable number of reaction chambers 102 and can optionally include one or more substrate handling systems.

Reaction chamber 102 can be configured as a CVD reactor, a cyclical deposition process reactor (e.g., a cyclical CVD reactor), an ALD reactor, a PEALD reactor, or the like, any of which may include plasma apparatus, such as direct and/or remote plasma apparatus.

Figure 2:
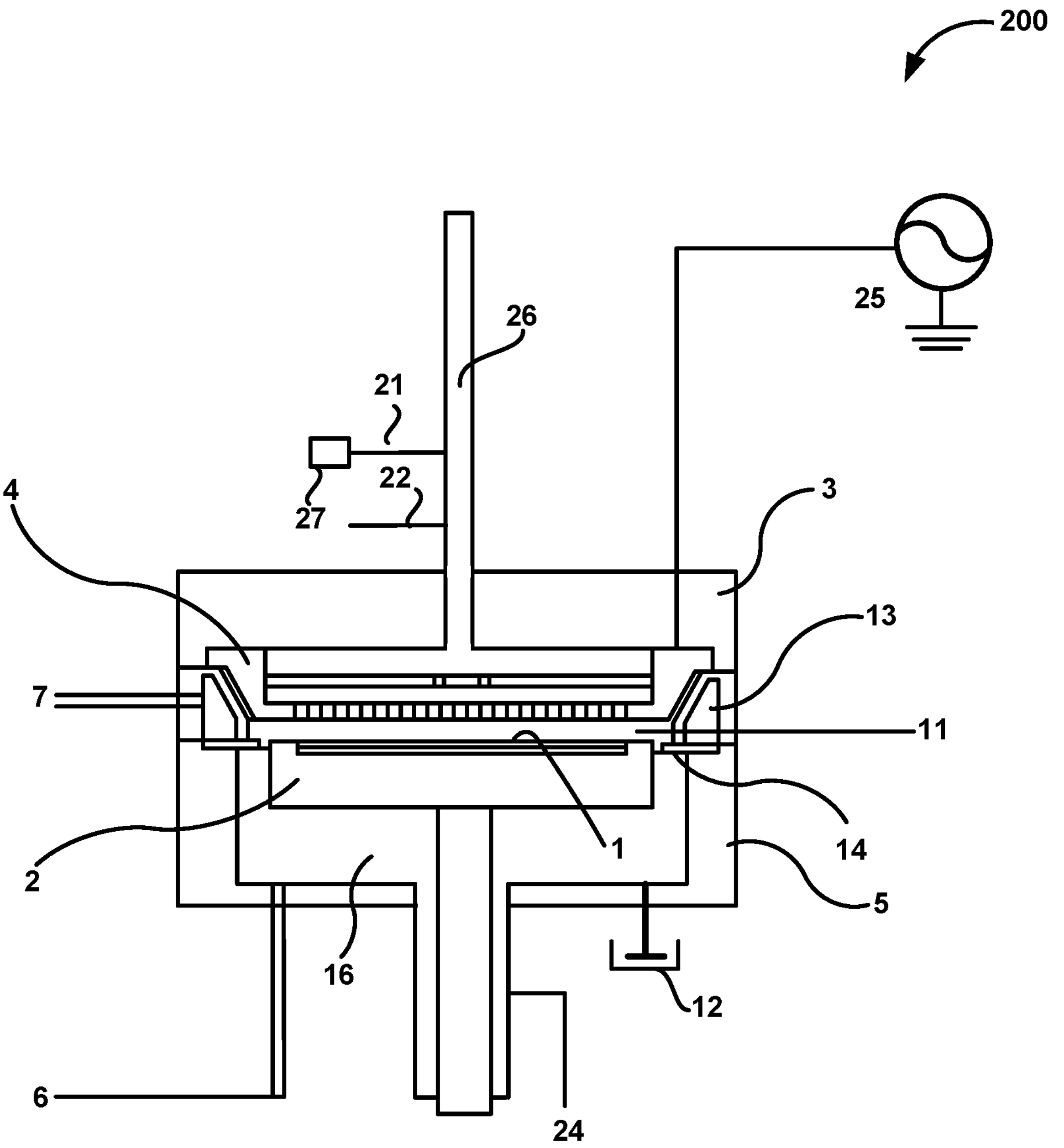
FIG. 2 illustrates a reactor in accordance with examples of the disclosure.

FIG. 2 illustrates an exemplary apparatus 200, suitable for use as a PEALD reactor. Apparatus 200 includes a reaction chamber 3, suitable for use as reaction chamber 102 and/or in connection with (i.e., as a portion of) system 100.

As illustrated in FIG. 2, by providing a pair of electrically conductive flat-plate electrodes 2, 4 that can be configured in parallel and facing each other in an interior 11 (reaction zone) of a reaction chamber 3, applying RF power (e.g., at 13.56 MHz and/or 27 MHz) from a power source 25 to one side, and electrically grounding the other side 12, a plasma can be generated between electrodes 2, 4. A temperature regulator may be provided in a lower stage 2, i.e., the lower electrode. A substrate 1 is placed on stage/lower electrode 2 and a temperature of stage 2 and/or the substrate can be maintained at a desired temperature. The upper electrode 4 can serve as a gas distribution device, such as a shower plate or the like, and various gases, such as a plasma gas, a reactant gas and/or a dilution gas, if any, as well as a gas mixture can be introduced into the reaction chamber 3 through a gas line 21 and a gas line 22, and through the shower plate 4. For example, a gas mixture (e.g., comprising two or more precursors) from apparatus 104 for providing a gas mixture to a reaction chamber can be provided to a gas injection port 26 via line 22 and a reactant from a reactant source 27 can be provided to gas injection port 26 via line 21. As illustrated, line 21 may desirably be upstream of line 22.

In reaction chamber 3, a circular duct 13 with an exhaust line 7 is provided, through which the gas in the interior 11 of the reaction chamber 3 is exhausted. Additionally, a transfer chamber 5 is disposed below the reaction chamber 3 and is provided with a gas seal line 24 to introduce seal gas into the interior 11 of the reaction chamber 3 via the interior 16 of the transfer chamber 5, wherein a separation plate 14 for separating the reaction zone and the transfer zone is provided. A gate valve through which the substrate may be transferred into or from the transfer chamber 5 is omitted from this figure. The transfer chamber is also provided with an exhaust line 6.

Returning to FIG. 1, apparatus 104 for providing a gas mixture to a reaction chamber includes a gas injection port 110, a mixing device 112, a first gas source 114, a second gas source 116, a third gas source 118, a first gas pulse valve 120, a second gas pulse valve 122, a third gas pulse valve 124, a first pressure flow control valve 126, a second pressure flow control valve 128, a third pressure flow control valve 130, one or more carrier gas sources 132, a purge valve 134, and a purge gas source 136. Apparatus 104 can be used to mix gases from two or more gas sources 114-118 by providing pulses of the two or more gases to mixing device 112, which is downstream of the pulsing valve(s). Apparatus 104 allows flexibility in timing (e.g., one gas can start before or after other gas flows to mixing device 112). Further, apparatus 104 can easily transition to a single gas injection system, without delay.

Gas injection port 110 can include tubing or the like to provide a gas mixture to a reaction zone of a reaction chamber. Gas injection port 110 can be integrated into reaction chamber 102 or can be separate. An exemplary gas injector port 26 suitable for use as injection port 110 is illustrated in FIG. 2.

Mixing device 112 is configured to receive two or more gases—e.g., from two or more of first gas source 114, second gas source 116, and third gas source 118 prior to entering reaction chamber 102. As illustrated, mixing device 112 can be upstream of and in fluid communication with the gas injection port 110. Mixing device 112 can include a volume that is larger than a volume of gas injection port 110/26. By way of example, a volume of mixing device 112 can range from about 5 to about 50 cc. A configuration of mixing device 112 can vary according to application. Mixing device 112 can include a torturous pathway or can be configured as a static mixer. In some cases, mixing device 112 can include a housing 138, which can be, for example, substantially a hollow cylinder with caps on each end. Another example of a suitable mixing device is discussed in more detail below in connection with FIG. 4.

First gas source 114, second gas source 116, and third gas source 118 can each include a vessel and a precursor stored within the respective vessel. By way of example, first gas source 114 can include a vessel and an indium precursor; second gas source 116 can include a vessel and a gallium precursor; and third gas source 118 can include a vessel and a zinc precursor. Exemplary indium precursors include TEI; TMI; 3-(dimethylamino)propyl]dimethyl-indium (DADI); DMZ; DEZ, In(acac)3; In(dmamp)2(OiPr); In(dmamp)3; In(dpguan)3; In(EtCp); InCp; In(iPrAMD)3; In(iPrFMD)3; In(N(SiMe3)2)Et2; In(PrNMe2)Me2; In(thd)3; InCl3; InMe2(edpa); InMe3(MeO(CH2)2NHtBu); InMe3; InEt3; [EtZn(damp)]2. Exemplary gallium precursors include TDMAG; TMGa TEGa; GaCl3; GaEt2Cl; (GaMe2NH2)3; Ga(acac)3; Ga(CpMe5); Ga(thd); Ga2(NMe2)6; GaMe2 (OiPr); GaMe2NH2; GaMe3(CH3OCH2CH2NHtBu). Exemplary zinc precursors include Zn(DMP)2; Zn(eeki)2; Zn(OAc)2; ZnCl2; ZnEt2; ZnMe2; ZnMe(OiPr). Although illustrated with three gas sources 114-118, exemplary apparatus can include any suitable number of two or more gas sources (e.g., four or more) coupled to mixing device 112. Further, reactor system 100 or apparatus 104 for providing a gas mixture to a reaction chamber can include a reactant source 142 that can be coupled to gas injection port 110 and/or to mixing device 112. The reactant source 142 can include one or more reactant vessels and one or more reactant sources. The reactant sources can include one or more of an oxygen reactant, a nitrogen reactant, and/or a carbon reactant. As discussed in more detail below, in accordance with examples of the disclosure, at least one reactant source 142 includes an oxygen reactant. Exemplary oxygen reactants are noted below. In some cases, reactant source 142 includes or is configured to provide multiple reactants, such as multiple oxygen reactants (e.g., $H_2O$ and $O_3$) at the same time or at substantially the same time (e.g., as defined herein) to a mixing device. As illustrated, reactor system 100 can also include an excitation source 146, such as a remote plasma unit or ozone generator, to form excited species from a reactant from reactant source 142, which can be flowed to mixing device 112 and/or gas injection port 110.

Two or more or each of first gas source 114, second gas source 116, and third gas source 118 can be coupled to mixing device 112 using a pulse valve. Additional gas sources can similarly be coupled to mixing device 112. For example, as illustrated, first gas source 114 (e.g., a vessel thereof) can be coupled to mixing device 112 via a first gas pulse valve 120; second gas source 116 (e.g., a vessel thereof) can be coupled to mixing device 112 via a second gas pulse valve 122; and third gas source 118 (e.g., a vessel thereof) can be coupled to mixing device 112 via a third gas pulse valve 124. Apparatus 104 and/or reactor system 100 can additionally include a pulse valve 144 between reactant source 142 and gas injection port 110 and/or mixing device 112. Pulse valves 120-124, 144 can be used to provide a desired amount (pulse) of a gas to mixing device 112 (or gas injection port 110). By way of examples, one or more of gas pulse valves 120-124, 144 or other pulse valves described herein can comprise a pneumatic or electric solenoid valve.

As further illustrated, a carrier gas from a carrier gas source 132 (which may include one or more carrier gas sources) can be used to supply one or more of the first, second, and/or third precursor to reaction chamber 102 and/or additional gases (e.g., a fourth gas) as described herein. In the illustrated example, carrier gas source 132 is coupled to a first pressure flow control valve 126 to supply a desired concentration of the first precursor to first gas pulse valve 120; carrier gas source 132 is coupled to a second pressure flow control valve 128 to supply a desired concentration of the second precursor to second gas pulse valve 122; and carrier gas source 132 is coupled to a third pressure flow control valve 130 to supply a desired concentration of the third precursor to third gas pulse valve 124. Pressure control valves 126, 128, 130 can be used to maintain a steady/desired pressure within the respective first vessel, second vessel, and third vessel to provide a controlled flow of the respective first precursor, second precursor, and third precursor. By way of example, a pressure control valve can be or include a pressure flow controller or mass flow controller.

Vacuum source 106 can include, for example, one or more vacuum sources. Exemplary vacuum sources include one or more dry vacuum pumps and/or one or more turbomolecular pumps.

Controller 108 can be configured to perform various functions and/or steps as described herein. Controller 108 can include one or more microprocessors, memory elements, and/or switching elements to perform the various functions. Although illustrated as a single unit, controller 108 can alternatively comprise multiple devices. By way of examples, controller 108 can be used to control gas flow to mixing device 112 and a gas mixture from mixing device 112 to vacuum source 106 and/or to reaction chamber 102. In some cases, controller 108 can be used to pulse two or more precursors (e.g., from sources 114-118) and/or a reactant from reactant source 142 to mixing device 112 and/or gas injection port 110. By way of further example, controller 108 can independently control each pressure flow control valve 126-130 and each gas pulse valve 120-124 to independently provide relative concentrations and relative amounts or ratios (e.g., by mass) of two or more precursors to mixing device 112. In the example illustrated in FIG. 1, controller 108 can be configured to open each pulse valve 120-124 at substantially the same time (e.g., within about 0.001 or about 0.005 seconds). A duration of a pulse as described herein can be about 0.01 to about 600 seconds or about 0.02 to about 10 seconds.

System 100 can also include a purge valve 134 fluidly coupled to a purge gas source 136 and to one or more of first gas pulse valve 120, second gas pulse valve 122, and/or third gas pulse valve 124. Purge valve 134 can be coupled to controller 108 and be used to purge pulse valves 120-124 and mixing device 112. Purge gas source 136 can include a vessel and a purge gas, such as one or more of nitrogen, argon, helium, or the like therein. Purge valve 134 can be, for example, a pneumatic or electric solenoid type valve.

Figure 3:
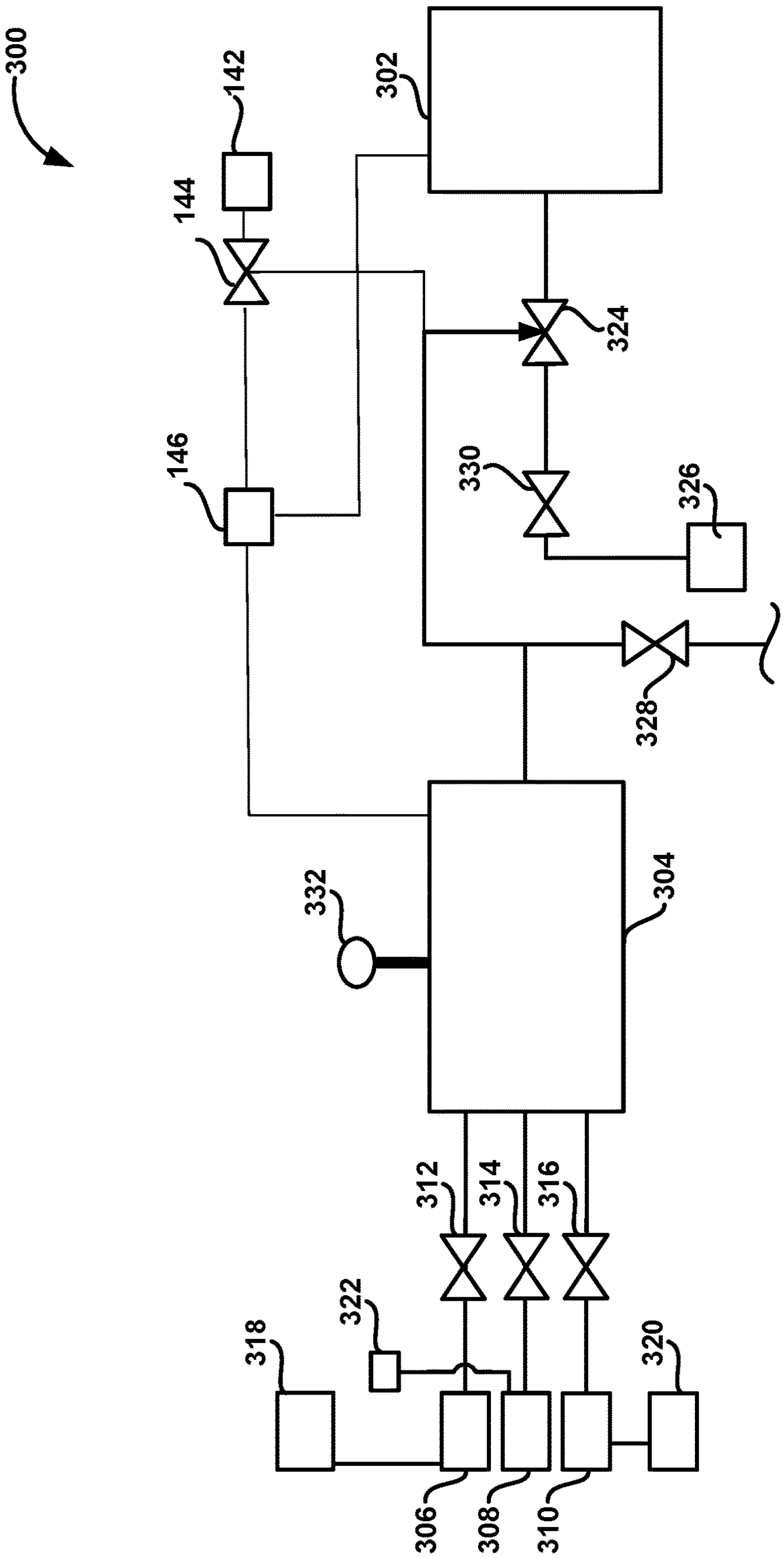
FIG. 3 illustrates another apparatus in accordance with the disclosure.

Turning now to FIG. 3, another apparatus 300 for providing a gas mixture to a reaction chamber is illustrated. Apparatus 300 is configured to mix gases upstream of a pulse valve. This configuration allows for larger mixing volumes and can promote more complete mixing of one or more gases within a mixing device. Apparatus 300 can be used in place of apparatus 104 in a reactor system, such as reactor system 100.

Apparatus 300 includes a gas injection port 302, a mixing device 304, a first gas source 306, a second gas source 308, a third gas source 310, a first gas valve 312, a second gas valve 314, a third gas valve 316, a first pressure flow control valve 318, a second pressure flow control valve 320, a third pressure flow control valve 322, one or more carrier gas sources (not separately illustrated in FIG. 3), a pulse valve 324, and a purge gas source 326. Apparatus 300 includes a pulse valve 324 between mixing device 304 and gas injection port 302, such that the mixing of gases in mixing device 304 occurs upstream of pulse valve 324. Apparatus (or system) 300 can also include a reactant gas source 142 and a pulse valve 144 as described above in connection with FIG. 1.

Gas injection port 302, mixing device 304, first gas source 306, second gas source 308, third gas source 310, first pressure flow control valve 318, second pressure flow control valve 320, third pressure flow control valve 322, the one or more carrier gas sources, and purge gas source 326 can be the same or similar to gas injection port 110, mixing device 112, first gas source 114, second gas source 116, third gas source 118, first pressure flow control valve 126, second pressure flow control valve 128, third pressure flow control valve 130, the one or more carrier gas sources 132, and purge gas source 136, described above in connection with FIG. 1. Apparatus 300 can also include a bypass valve 328, which can be a pneumatic or electric solenoid type valve and a purge valve 330, which can be the same or similar to purge valve 134.

As described above, first pressure flow control valve 126, second pressure flow control valve 128, and/or third pressure flow control valve 130 can be used to control an amount of a carrier gas that flows to the respective first gas source 306, second gas source 308, and third gas source 310 by controlling a (e.g., steady) pressure within a corresponding vessel to thereby control a flow and/or a desired or predetermined concentration of a precursor from the gas source to mixing device 304. For example, an amount of gas from each gas from source 306-310 can be set by the source vapor pressure/carrier gas pressure ratio with the carrier gas pressure controlled by the respective first pressure flow control valve 126, second pressure flow control valve 128, and third pressure flow control valve 130. The carrier gas/precursor flow can be controlled by, for example, a fixed orifice, a needle valve, a mass flow controller, or a volumetric flow controller.

First gas valve 312, second gas valve 314, and third gas valve 316 can include a pneumatic or electric solenoid type valve and/or can form part of a flow meter and/or a mass flow controller. In the illustrated example, first gas valve 312, second gas valve 314, and third gas valve 316 provide metered amounts of a first gas, a second gas, and a third gas, from first gas source 306, second gas source 308, and third gas source 310 to mixing device 304.

By way of examples, one or more of first gas valve 312, second gas valve 314, and third gas valve 316 (e.g., each or such valves) forms part of a mass flow controller. In these cases, a setpoint for the mass flow controllers can determine a composition of a gas mixture within mixing device 304, which is provided to injection port 302. An exemplary sequence to provide the gas mixture to injection port 302 can include filling mixing device 304 by opening and (e.g., controllably) flowing gas using first gas valve 312, second gas valve 314, and third gas valve 316 into mixing device 304. At substantially the same time, first gas valve 312, second gas valve 314, third gas valve 316 and pulse valve 324 can be opened to supply the gas mixture to injection port 302. The valves can be controlled using one or more controllers, such as controller 108.

Pulse valve 324 can be used to pulse a gas mixture from mixing device 304 and/or a purge gas from purge gas source 326 and/or a reactant from mixing device 304 or reactant source 142 to gas injection port 302. In accordance with examples of the disclosure, first gas valve 312, second gas valve 314, third gas valve 316, and/or reactant gas pulse valve 144 and pulse valve 324 open and close at about the same time—e.g., within about 0.001 or about 0.005 seconds to pulse the gas (e.g., a mixture) to a reaction chamber, such as reaction chamber 102.

In accordance with further examples of the disclosure, apparatus 300 includes a pressure monitor 332 to measure a pressure of the mixing device 304. In these cases, a controller (e.g., controller 108) can be further configured to fill mixing device 304 to a desired (e.g., set) pressure. Once the pressure has been reached, first gas valve 312, second gas valve 314, and third gas valve 316 are shut off. Alternatively, first gas valve 312, second gas valve 314, and third gas valve 316 can be opened to a set flow for a period of time to fill mixing device 304. In these cases, no significant additional volume is downstream of pulse valve 324 and between mixing device 304 and gas injection port 302.

To purge pulse valve 324 and injection port 302, purge valve 330 can be opened and pulse valve 324 can pulse a purge gas from purge gas source 326 into injection port 302 and/or a reaction chamber.

Controller 108 or one or more similar controllers can be used to control valves 144, 312-320, 324, 330, and 328, set and monitor pressure using pressure monitor 332, and perform other functions described herein in connection with FIGS. 1-3.

Figure 4:
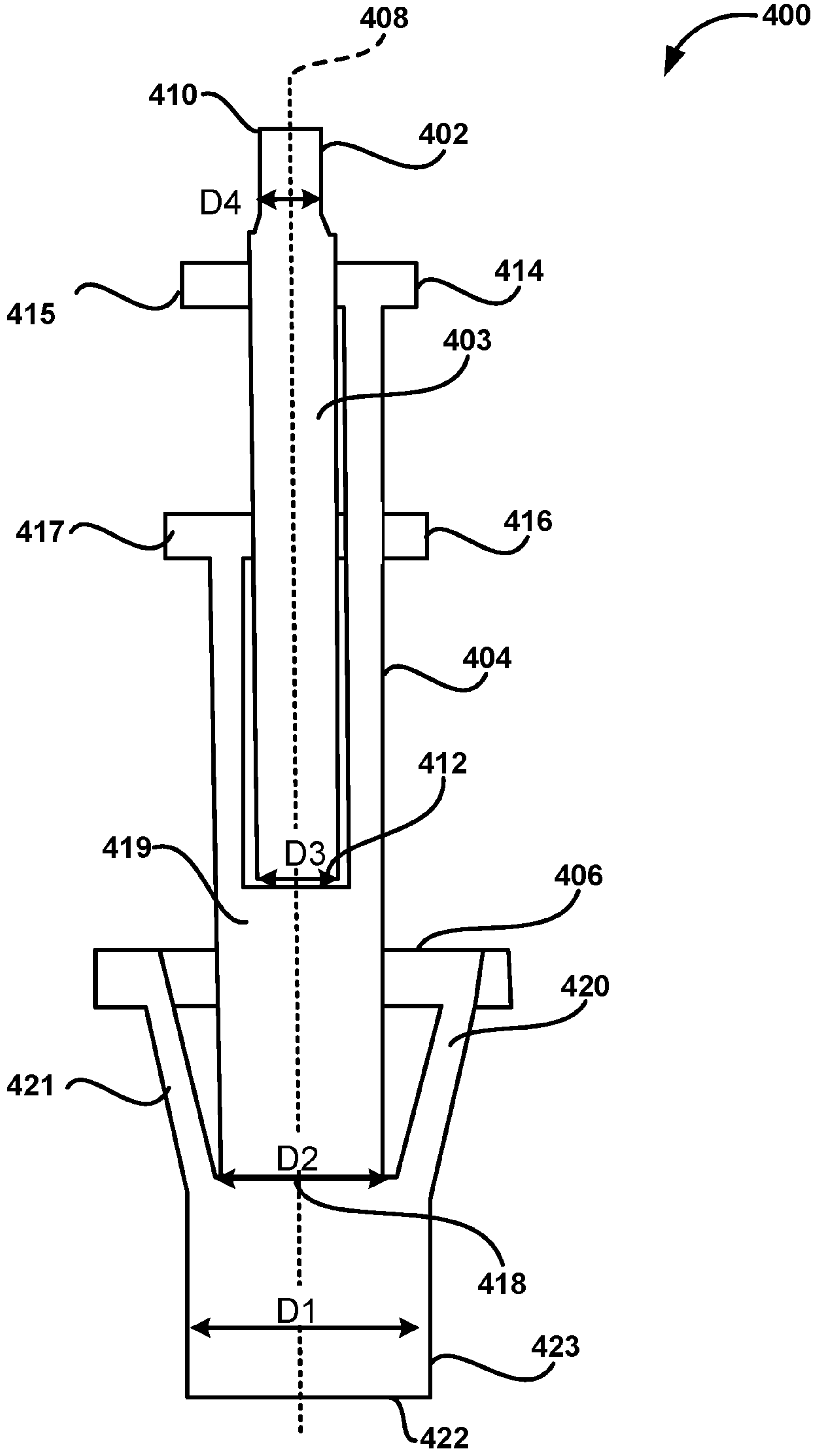
FIG. 4 illustrates a gas mixing device in accordance with examples of the disclosure.

FIG. 4 illustrates a mixing device 400 suitable for use as mixing device 112 or 304. Mixing device 400 includes a first section 402, a second section 404, and a third section 406. As illustrated, first section 402, second section 404, and third section 406 can cascade, such that an outlet of first section 402 is within second section 404, and an outlet of second section 404 is within third section 406. Additionally or alternatively, first section 402, second section 404, and third section 406 can be coaxial—e.g., about an axis 408. Although illustrated with three sections, a cascading mixing device can suitably include two or more sections as described herein.

First section 402 includes a first inlet 410, having a diameter D4, a first outlet 412 having a diameter D3, and a volume 403 therebetween. In the illustrated example, D3 is larger than D4.

Second section 404 can include one or more second inlets 414, 415, 416, 417 a second outlet 418, and a second volume therebetween. A diameter D2 of outlet 418 can be greater than a diameter of one or more, individually or in total, inlet 414, 416. Further, diameter of D2 can be greater than D3 and/or D4.

As illustrated, first inlet 410 can be upstream of second inlet 414, 416. Further, first outlet 412 can be downstream of second inlet 414, 416 (e.g., for one or more gases). And, first outlet 412 can be upstream of second outlet 418.

Third section 406 can include one or more third inlets 420, 421, a third outlet 422 and a volume 423 therebetween. Third outlet 422 can be coupled to a reaction chamber, a gas injection port, and/or one or more (e.g., pulse) valves as described herein. Volume 423 can have a diameter or similar cross section of D1, wherein D1 can be greater than D2, D3, and/or D4. Further, as illustrated, third inlet 420 is downstream of second inlet 414, 416, and upstream of second outlet 418.

In accordance with examples of the disclosure, one or more reactants are provided to the mixing devices upstream of one or more precursors. For example, the reactant can be provided to first inlet 410, the first precursor can be provided to second inlet 414 or another inlet downstream of first inlet 410, and the second precursor can be provided to third inlet 420 or another inlet downstream of first inlet 410.

With reference to FIGS. 1 and 4, a controller, such as controller 108, can be configured to (e.g., selectively) provide the reactant to the first inlet—e.g., via pulse valve 144 or gas injection port 110. For example, controller 108 can be configured to provide the reactant to first inlet 410 during each deposition cycle and/or after a predetermined number of deposition cycles and/or after a predetermined number of substrates have been processed.

In accordance with various examples of the disclosure, a deposition process is provided. Exemplary deposition processes can use reactor system 100, apparatus 300, and/or mixing device 400, as described above. For example, an exemplary deposition process can include providing a reactor system or apparatus as described herein, providing a reactant, and providing at least one precursor. More particularly, an exemplary deposition process can include providing an apparatus comprising a gas injection port, a mixing device upstream of and in fluid communication with the gas injection port, a first gas source comprising a first vessel and a reactant therein, a second gas source comprising a second vessel and a first precursor therein, a first gas pulse valve fluidly coupled to the first vessel and to the mixing device, and a second gas pulse valve fluidly coupled to the second vessel and to the mixing device, wherein the mixing device comprises a first inlet and a second inlet, wherein the first inlet is upstream of the second inlet; providing the reactant to the mixing device through the first inlet; and providing the first precursor to the mixing device through the second inlet. Providing the reactant to the mixing device upstream of the precursor(s) can reduce particle formation and/or flaking of the growing film that might otherwise occur and/or increase a lifetime of the mixing device. The reactant can be introduced during a deposition cycle that includes pulsing a mixture of precursors and separately pulsing the reactant. Additionally or alternatively, the deposition process can include periodically pulsing the reactant to the mixing device after a number of deposition cycles and/or a number of substrates are processed to prolong a lifetime of the mixing device—i.e., a period of use of the mixing device without cleaning or refurbishing. The surface of the mixing device can be refreshed using the reactant, such as an oxygen reactant (e.g., $O_2$, $H_2O_2$, $O_3$, $H_2O$, oxygen radicals, atomic oxygen or excited species thereof (e.g., formed from a plasma or other excitation source), or the like). Such periodic pulsing could be, for example, before or after a substrate is processed. For example, the reactant could be supplied to the mixing device while no substrate is within the reaction chamber. A reactant that is used to condition the mixing device and a reactant used for a deposition reaction can be the same or different and can include multiple reactants (e.g., $H_2O$ and $O_3$, or any other combination of reactants described herein). When multiple reactants are provided to the mixing device, at least one or each or the reactants can desirably be provided upstream of the provision of any of the precursors. For example, with reference to FIG. 4.

In some embodiments, the material grown to upstream of the gas injection port and/or in the mixing device, has a density from to about 50% to about 120%, from to about 70% to about 110%, from to about 80% to about 100%, from to about 85% to about 99% from the bulk density of the grown material. In some embodiments, the material grown to upstream of the gas injection port and/or in the mixing device, has impurities such as halides, for example Cl, or carbon <30 at-%, <20 at-%, <10 at-%, <7 at-%, <5 at-%, <3 at-%, <2 at-% or <1 at-%. In some embodiments, the material grown to upstream of the gas injection port and/or in the mixing device, has impurities such as halides, for example Cl, or carbon from 50% to about 500%, from 90% to about 300%, from 100% to about 250%, from 105% to about 200%, from 105% to about 200%, from 105% to about 200% when compared to the material grown on the substrate.

In accordance with examples of these embodiments, the deposition process can include pulsing the reactant(s) to the device. For example, pulse valve 144 can be used to pulse a reactant (e.g., an oxidant) to the mixing device.

The deposition process can further include providing a second precursor and/or a third precursor to the mixing device. The first precursor, the second precursor, and/or the third precursor can be pulsed to the mixing chamber as described above. Two or more of the first precursor, the second precursor, and the third precursor can be mixed within the mixing device.

In accordance with examples of the disclosure, a steady state pressure within a first vessel used to supply the first precursor, a second vessel used to supply the second precursor, a third vessel used to supply the third precursor, and/or a reactant vessel used to supply the reactant is maintained at a steady state pressure (e.g., within about +/−10% or +/−5% or +/−2% of a target pressure to provide a controlled flow of the reactant to the mixing device.

An exemplary deposition process can further include providing a purge gas to the one or more gas pulse valves, such as the gas pulse valves described above, to purge the gas pulse valves.

In accordance with yet additional examples, the deposition process can include a step of forming a plasma. For example, a remote excitation source, such as remote excitation source (e.g., remote plasma unit) 146 can be used to form excited species from one or more reactants prior to introduction to the mixing device and/or the gas injection port.

In accordance with further examples of the disclosure, a deposition process includes providing an apparatus comprising a gas injection port, a mixing device upstream of and in fluid communication with the gas injection port, a first gas source comprising a first vessel and a first precursor therein, and a second gas source comprising a second vessel and a second mixture precursor therein, wherein the mixing device comprises a first inlet and a second inlet, wherein the first inlet is upstream of the second inlet, and pulsing a mixture of the first precursor and the second precursor from the mixing device to the gas injection port. The method can further include providing a reactant to the mixing device—e.g., as described above. For example, the reactant can be provided upstream of an inlet used to provide one or more precursors to the mixing device. Exemplary methods can further include pulsing the reactant to the gas injection port. In such cases, the steps of pulsing the reactant and pulsing the mixture can be separated in time. In some cases, a combination of the reactant and the mixture is pulsed to the gas injection port. In some cases, the reactant, the first precursor, and the second precursor are mixed within the mixing device to form the gas mixture. Such a mixture can be pulsed to the gas injection port and/or to the reaction chamber.

In accordance with further examples, the deposition process can include a step of purging one or more of the pulse valves using a purge gas. In accordance with yet further examples, the deposition process can include controlling a flow of an inert gas to one or more of the first gas source, the second gas source, and/or the third gas source.

The example embodiments of the disclosure described above do not limit the scope of the invention, since these embodiments are merely examples of the embodiments of the invention. For example, although illustrated with three gas sources, examples can include two, four, or more gas sources that may be configured in a manner similar to the illustrated examples. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

The invention claimed is:

1. A deposition process comprising:

providing an apparatus comprising:

a gas injection port;

a mixing device upstream of and in fluid communication with the gas injection port;

a first gas source comprising a first vessel and a reactant therein;

a second gas source comprising a second vessel and a first precursor therein;

a first gas pulse valve fluidly coupled to the first vessel and to the mixing device; and a second gas pulse valve fluidly coupled to the second vessel and to the mixing device, wherein the mixing device comprises a first inlet and a second inlet, and wherein the first inlet is upstream of the second inlet, providing a carrier gas upstream and to the first gas source;

providing the reactant to the mixing device through the first inlet; and providing the first precursor to the mixing device through the second inlet.

2. The deposition process of claim 1, wherein the step of providing the reactant to the mixing device comprises pulsing the reactant to the mixing device.

3. The deposition process of claim 1, wherein the step of providing the first precursor to the mixing device comprises pulsing the first precursor to the mixing device.

4. The deposition process of claim 1, further comprising maintaining a steady state pressure within the first vessel to provide a controlled flow of the reactant to the mixing device.

5. The deposition process of claim 1, further comprising providing a second precursor to the mixing device and mixing the second precursor with the first precursor within the mixing device.

6. The deposition process of claim 1, further comprising providing a purge gas to the first gas pulse valve to purge the first gas pulse valve.

7. The deposition process of claim 1, further comprising a step of forming a plasma.

8. A deposition process comprising:

providing an apparatus comprising:

a gas injection port;

a mixing device upstream of and in fluid communication with the gas injection port;

a pulse valve downstream of the mixing device;

a purge valve upstream of the pulse valve;

a first gas source comprising a first vessel and a first precursor therein; and a second gas source comprising a second vessel and a second mixture precursor therein, wherein the mixing device comprises a first inlet and a second inlet, and wherein the first inlet is upstream of the second inlet; and pulsing a mixture of the first precursor and the second precursor from the mixing device to the gas injection port.

9. The deposition process of claim 8, further comprising providing a reactant to the mixing device.

10. The deposition process of claim 9, wherein the reactant is provided to the first inlet and is provided upstream of the first precursor and the second precursor.

11. The deposition process of claim 9, further comprising pulsing the reactant to the gas injection port, wherein the steps of pulsing the reactant and pulsing the mixture are separated in time.

12. The deposition process of claim 9, wherein a combination of the reactant and the mixture is pulsed to the gas injection port.

13. The deposition process of claim 8, further comprising a step of purging the pulse valve using a purge gas.

14. The deposition process of claim 8, further comprising controlling a flow of an inert gas to the first gas source.

15. The deposition process of claim 14, further comprising controlling a flow of the inert gas to the second gas source.

16. An apparatus for providing a gas mixture to a reaction chamber, the apparatus comprising:

a gas injection port;

a mixing device upstream of and in fluid communication with the gas injection port;

a first gas source comprising a first vessel and a reactant therein;

a second gas source comprising a second vessel and a first precursor therein;

a third gas source comprising a third vessel and a second precursor therein;

a first gas valve fluidly coupled to the first vessel and to the mixing device;

a second gas valve fluidly coupled to the second vessel and to the mixing device; and a purge gas valve upstream of the first gas valve, wherein the mixing device comprises a first inlet, a second inlet, and a third inlet, wherein the first inlet is upstream of the second inlet, wherein the second inlet is upstream of the third inlet, wherein the reactant is provided to the first inlet, wherein the first precursor is provided to the second inlet, and wherein the second precursor is provided to the third inlet.

17. The apparatus of claim 16, further comprising a controller configured to provide the reactant to the first inlet.

18. The apparatus of claim 17, wherein the controller is configured to provide the reactant to the first inlet after a predetermined number of deposition cycles.

19. The apparatus of claim 17, wherein the reactant, the first precursor, and the second precursor are mixed within the mixing device to form the gas mixture.

20. The apparatus of claim 16, further comprising a pulse valve between the mixing device and the gas injection port.

* * * * *